United States Patent
Auburger et al.

[11] Patent Number: 6,047,604
[45] Date of Patent: Apr. 11, 2000

[54] PRESSURE SENSOR COMPONENT FOR MOUNTING ON THE COMPONENT-MOUNTING SURFACE OF A PRINTED CIRCUIT BOARD

[75] Inventors: Albert Auburger, Regenstauf; Jürgen Winterer, Nürnberg, both of Germany

[73] Assignee: Siemens Aktiengesellschaft, Munich, Germany

[21] Appl. No.: 09/221,784

[22] Filed: Dec. 28, 1998

Related U.S. Application Data

[63] Continuation of application No. PCT/DE97/01232, Jun. 17, 1997.

[30] Foreign Application Priority Data

Jun. 28, 1996 [DE] Germany .......................... 196 26 086

[51] Int. Cl.$^7$ ........................................... G01L 9/06
[52] U.S. Cl. ............................... 73/756; 73/727; 73/754; 257/419
[58] Field of Search ............................ 73/724, 727, 754, 73/756; 257/419

[56] References Cited

FOREIGN PATENT DOCUMENTS 40 17 697 A1  12/1991  Germany .
41 35 183 A1   5/1992  Germany .

OTHER PUBLICATIONS

Japanese Patent Abstract No. 4–127461 a (Sonobe), dated Apr. 28, 1992.
Japanese Patent Abstract No. JP41 25438 (Masahiro), dated Apr. 24, 1992.
Japanese Patent Abstract No. JP4323909 (Jun), dated Nov. 13, 1992.
Japanese Patent Abstract No. JP7113706 (Kazuyuki), dated May 2, 1995.
Japanese Patent Abstract JP8017870 (Kazuya et al.), dated Jan. 19, 1996.
Japanese Patent Abstract No. 5–3284 (a) (Nishino), dated Jan. 8, 1993.
Victor J. Adams: "Epoxy Package for Pressure Sensor", Motorola Inc, Technical Developments, vol. 12, Apr. 1991, p. 154.

*Primary Examiner*—Joseph L. Felber
*Attorney, Agent, or Firm*—Herbert L. Lerner; Lawrence A. Greenberg

[57] ABSTRACT

The pressure sensor component is mountable on the component-mounting surface of a printed circuit board. The component has a chip carrier of electrically insulating material formed with a substantially flat chip carrier surface. A semiconductor chip with a pressure sensor is fastened on the chip carrier surface. Electrode connections with a surface-mountable structure penetrate the chip carrier and they are electrically connected to the semiconductor chip. The chip carrier is filled with a flowable filler completely covering the semiconductor chip.

15 Claims, 1 Drawing Sheet

PRESSURE SENSOR COMPONENT FOR MOUNTING ON THE COMPONENT-MOUNTING SURFACE OF A PRINTED CIRCUIT BOARD

CROSS-REFERENCE TO RELATED APPLICATION

This is a continuation of copending International Application PCT/DE97/01232, filed Jun. 17, 1997, which designated the United States.

BACKGROUND OF THE INVENTION

Field of the Invention

The invention relates to a pressure sensor component that can be mounted on the component-mounting surface of a printed circuit board. The component comprises a chip carrier, preferably made from an electrically insulating material, which has an approximately flat chip carrier surface supporting a semiconductor chip with a pressure sensor. Electrode connections with a surface mountable configuration penetrate the chip carrier and are electrically connected to the semiconductor chip.

The use of surface mountable semiconductor component housings in an SMD (Surface Mounted Design) configuration renders it possible to make contact on a user printed circuit board in a cost-effective space-saving fashion. This also holds for sensor components used for pressure measurement. With this form of mounting, the component connections no longer plugged into holes in the printed circuit board as in the case of insertion mounting, but are mounted on connecting areas on the printed circuit board and soldered there. Components can be smaller for surface mounting than for insertion mounting, since hole and pad diameters of the printed circuit board no longer determine the pitch of the connections. Furthermore, holes required only for mounting on the printed circuit board are eliminated, it being possible for the holes still required only for through-plating to be executed as small as is technically possible. Since, in addition, it is also possible for the printed circuit board to be mounted on both sides, surface mounting can deliver a substantial saving in space and a considerable reduction in cost. A particularly small overall height of the electronic component results in this case when the electrode connections, which penetrate the chip carrier and are electrically connected to the semiconductor chip, are constructed in the form of pins which are led out of at least two sides of the chip carrier and are bent to form short rocker shaped connecting stubs and cut.

In order to measure pressures, the medium to be measured must be brought up to the sensor, or the pressure prevailing in the medium must be transmitted to the sensor. For this purpose, the pressure sensor is arranged in a component housing open on one side so that the sensitive chip surface of the pressure sensor can come directly into contact with the medium to be measured. There is the disadvantage with this configuration that the sensitive chip sensor, but also the other constituents of the pressure sensor component open on one side, are exposed to damaging environmental influences, resulting in the risk of corrosion of the constituents of the component which can lead as far as destruction of the component.

Patent Abstracts of Japan, Vol. 095, No. 008 (JP A 0 7113706) discloses a pressure sensor which has a silicon gel inside the housing. The component described is not suitable for SMD mounting. The housing is closed by means of a cover.

SUMMARY OF THE INVENTION

It is accordingly an object of the invention to provide a pressure sensor component for mounting on a component-mounting surface of a printed circuit board which overcomes the above-mentioned disadvantages of the heretofore-known devices and methods of this general type and which is constructed in such a way as reliably to avoid corrosion of the constituents exposed to the environmental influences, with the risk of destruction of the component.

With the foregoing and other objects in view there is provided, in accordance with the invention, a pressure sensor component for mounting on the component-mounting surface of a printed circuit board, comprising:
 a chip carrier produced from an electrically insulating material and formed with an approximately flat chip carrier surface;
 a semiconductor chip with a pressure sensor fastened on the chip carrier surface;
 electrode connections with a surface-mountable structure electrically connected to the semiconductor chip and penetrating through the chip carrier;
 a flowable filler filling the chip carrier and completely covering the semiconductor chip; and
 the chip carrier having a lower part lifted above the component-mounting surface of the printed circuit board and lateral parts on two sides of the lower part.

In accordance with an added feature of the invention, the chip carrier is open on a side thereof opposite from the component-mounting surface of the printed circuit board, and the lateral parts defining side walls of the chip carrier formed with a continuous flow-stopping edge on an inner wall surface.

As protection against environmental influences, the invention proposes the use of a flowable filler which completely covers the sensitive semiconductor chip. The filler is flowable and thus satisfactorily elastic or flexible enough to pass on pressures to the pressure sensor without falsifying the measurement results. As a result, the two requirements placed, of the best possible pressure coupling and separation of the medium to be measured, are met.

The use of a flowable filler as protection against environmental influences constitutes a solution that is cost-effective and capable of an inline design, for cladding pressure sensors which are fabricated in large batches. In this case, it is desirable to have specific metering of the flowable filler and a controlled shape filling behavior. In order to achieve this, it is provided in a particularly preferred embodiment of the invention that the chip carrier is of unilaterally open construction on its side averted from the component-mounting surface of the printed circuit board, and the side walls of the chip carrier are fitted with a flow stopping edge continuously arranged on the inner side. The flow stopping edge effects a defined stoppage of the capillary forces of the adhesive filler and in this way prevents the filler from rising up over the housing rims. It is possible in this way to prevent dragging in the filler in other subsequent steps when fabricating the pressure sensor component, and thus to prevent the associated soiling of or damage to the fabrication tools. According to the invention, the flowable filler can thus be positioned in a precisely defined way inside the component, it also being the case that the filler is reliably prevented from escaping when the chip carrier, which is open on one side, is mounted standing on its head. In an advantageous way, the flow stopping edge also renders it possible, given an appropriately configured arrangement, for the effective thickness of the flowable filler to be kept as low as possible in order not to worsen excessively the undesired influence on the measurement sensitivity of the pressure sensor with regard to the accelerations and/or pressures to be measured, which sensitivity is known to be reduced with increasing gel thickness.

In accordance with an additional feature of the invention, the flowable filler is disposed to encase all corrosion-susceptible structural elements, in particular the metallic elements such as connecting wires and supporting carriers for the semiconductor chip.

In accordance with another feature of the invention, the flowable filler is a gel.

The invention is particularly preferred in the context of a surface-mountable pressure sensor component. In that regard, in accordance with a further feature of the invention, the electrode connections penetrating the chip carrier are terminal pins led out of at least one side of the chip carrier and bent and cut to form short rocker-shaped connecting stubs.

In accordance with again an added feature of the invention, the chip carrier is produced in one piece.

In accordance with again an additional feature of the invention, the pins are bent to form bends inside the side parts of the chip carrier.

In accordance with again another feature of the invention, the pins have ends projecting from the side parts of the chip carrier, the ends being slightly inclined towards the component-mounting surface of the printed circuit board.

In accordance with again a further feature of the invention, the chip carrier is formed with outer boundary surfaces facing the component-mounting surface of the printed circuit board, the outer boundary surfaces of the chip carrier following an essentially inverted V-shape in a cross section of the chip carrier.

In accordance with yet an added feature of the invention, a greatest spacing between the outer boundary surfaces and the printed circuit board is substantially 0.1 to substantially 0.5 mm.

In accordance with yet another feature of the invention, the chip carrier is produced from a thermoplastic material.

In accordance with a concomitant feature of the invention, the pressure sensor is a piezoresistive pressure sensor or a capacitive pressure sensor.

Other features which are considered as characteristic for the invention are set forth in the appended claims.

Although the invention is illustrated and described herein as embodied in a pressure sensor component which can be mounted on the component-mounting surface of a printed circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
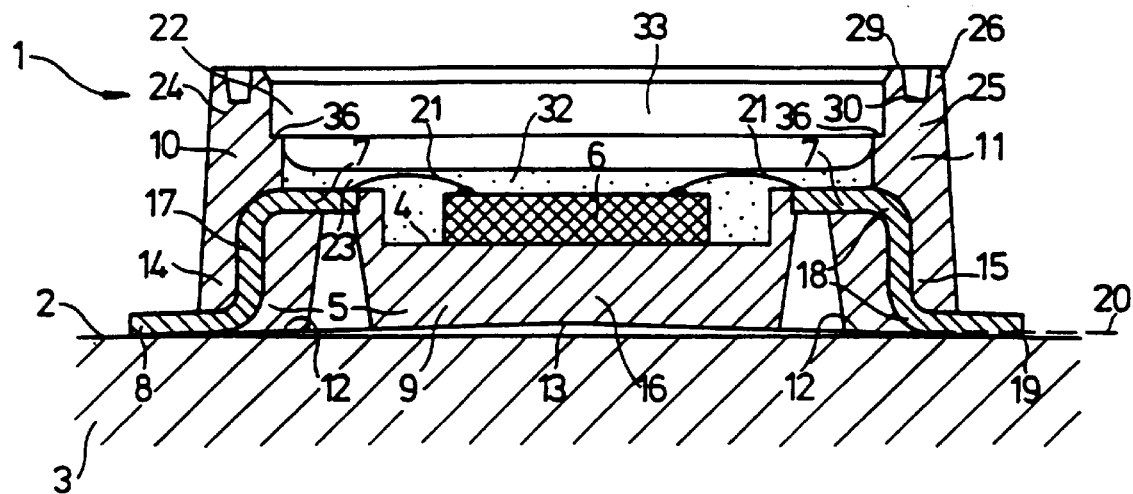
FIG. 1 is a diagrammatic vertical sectional view of a pressure sensor component in accordance with an exemplary embodiment of the invention.
Figure 2:
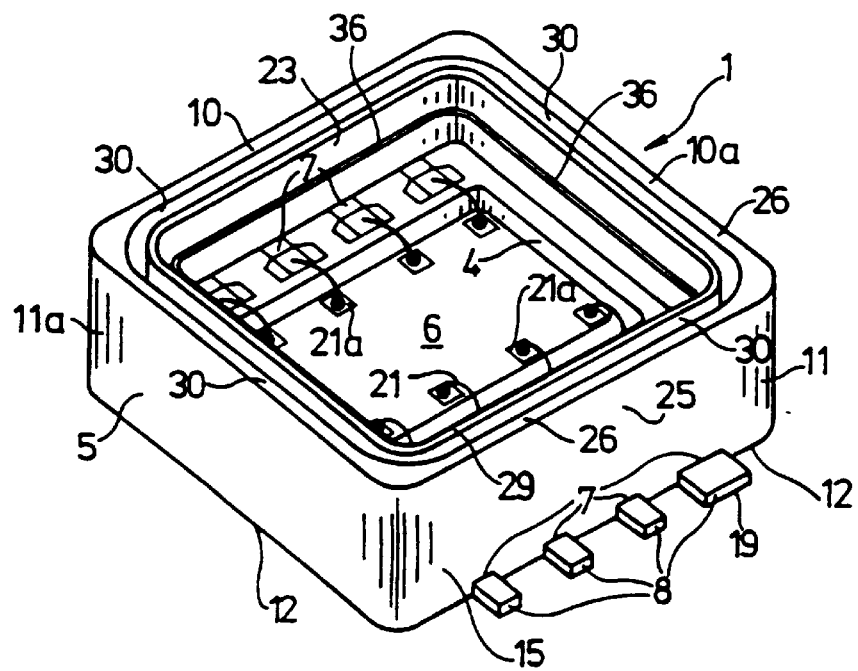
FIG. 2 is a diagrammatic perspective view of the chip carrier of a pressure sensor component according to the exemplary embodiment.

Referring now to the figures of the drawing in detail and first, particularly, to FIG. 1 thereof, there is seen an exemplary embodiment of an inventive pressure sensor component 1 for surface mounting on the component-mounting surface 2 of a printed circuit board 3. The pressure sensor component 1 has a chip carrier 5, formed with an approximately flat chip carrier surface 4 and made from electrically insulating plastic material. On the chip carrier surface 4 there is fastened a semiconductor chip 6 with an integrated pressure sensor and an electronic circuit assigned to the latter. The pressure sensor and the circuit are not illustrated in more detail for the purpose of clarity in the figures. Electrode connections 7 penetrate the chip carrier 5 and are electrically connected to the semiconductor chip 6. The ends 8 of the terminals 7 are mounted on connecting areas (not represented in more detail) on the component-mounting surface 2 of the printed circuit board 3 and are soldered there.

The chip carrier 5, which is, in particular, of one piece and produced by means of a plastic casting process known per se, comprises a lower part 9 which is lifted with respect to the component-mounting surface 2 and on which the semiconductor chip 6 is supported, as well as side parts 10, 10a and 11, 11a, which are arranged at the sides of the lower part 9 and form the laterally closing housing walls of the pressure sensor housing. In accordance with the way represented in FIG. 1, which is essentially true to scale, the chip carrier 5 is constructed in such a way that the outer boundary surfaces 12, 13, facing the component-mounting surface 2 of the printed circuit board 3, of the chip carrier 5 have a spacing from the component-mounting surface 2 of the printed circuit board 3 which increases continuously from the lower edge regions 14, 15 to the middle region 16 of the chip carrier 5. In particular, the outer boundary surfaces 12, 13 of the chip carrier 5 have, when seen in cross section, an essentially inverted V-shaped course, or a course configured in the shape of a roof in such a way that the tip of the inverted V is arranged in the middle, the largest spacing at this point from the printed circuit board having a value of approximately 0.1 mm to approximately 0.5 mm. It is also provided that the electrode connections 7, which penetrate the chip carrier 5 and are electrically connected to the semiconductor chip 6, are constructed in the form of pins which are led out of at least two sides of the chip carrier 5 and are bent to form short rocker-shaped connecting stubs 17 and cut. Such an configuration ensures a minimum overall height of the sensor component. Furthermore, the bends 18 of the pins are accommodated inside the side parts 10, 11, of the chip carrier 5, something which has the advantage that the dimensions of the housing are further reduced, the size of the leadframe is reduced, and in addition the leakage paths for corrosive media are substantially lengthened, and thus impregnation with chemicals is reduced. Moreover, such an configuration permits mechanical anchoring of the leadframe and/or the electrode connections 7 inside the housing of the component, and thus permits an additional increase in mechanical stability overall. Furthermore, the ends 8, projecting from the side parts 10, 11 of the chip carrier 5, of the pins have a slight inclination with respect to the component-mounting surface 2 of the printed circuit board 3 which is such that the outermost edge 19, facing the component-mounting surface 2, of the end 8 of the pins has a spacing of approximately 0.1 mm from the auxiliary plane 20 (represented by dashes). This configuration ensures that contact between the component and the component-mounting surface 2 of the printed circuit board 3 is provided only by the outermost ends 8 of the pins, something which takes account, together with the favorable housing configuration represented, in the case of which the lower part of the printed circuit board is constructed in a lifted fashion and, as represented, the housing is constructed in the shape of a roof, of possible warpage of the printed circuit board 3, and in addition problems are avoided in mounting the component on the printed circuit board 3 and in the later use of the printed circuit board 3. In an advantageous way, it is possible in this case to eliminate adjustment (so far required during mounting) by means of so-called trimming and shaping tools, and simultaneously to take account of the prescribed demands based on ground clearance to be maintained. Mounting can be carried out more favorably, since good adhesion of the mounting adhesive is ensured and, moreover, possible tolerances of the printed circuit board 3 are compensated with regard to warpage, and strains of a thermal and/or mechanical nature are counteracted since contact with the printed circuit board 3 occurs only through the pins.

As represented, it is possible to make use for the electric connection between the pressure sensor constructed in an integrated fashion on the semiconductor chip 6 and/or the electronic circuit assigned to said sensor and the electrode connections 7 of a wire contacting method in which the bonding wires 21 are fastened on metallic chip contact pads 21*a* on the chip, and are drawn onto the electrode pin respectively to be connected. Moreover, it is also possible to use for this electric connection so-called spider contacting in which instead of bonding wires use is made of an electrically conducting leadframe.

The pressure sensor integrated on the semiconductor chip 6 made from silicon constitutes a so-called piezoresistive sensor in which provision is made of a thin silicon membrane which is produced in the surface of the chip 6 using micromechanical methods and is electrically coupled to pressure-dependent resistors which are likewise constructed in the silicon substrate and are connected in a bridge circuit in a way known per se. Likewise integrated in the semiconductor chip 6 is a circuit, assigned to the sensor, which serves the purpose of signal conditioning (amplification and correction) but also serves to calibrate and compensate the sensor. By contrast with other designs, such semiconductor pressure sensors on which the invention is based are particularly suitable for those applications in which a minimum overall size is important, that is to say, for example, for pressure measurements in the field of motor vehicles or, for example, in the measurement of brake pressures, tire pressures, combustion chamber pressures and the like. In addition to semiconductor pressure sensors which operate according to the principle of piezoresistive pressure measurement, it is also possible, moreover, to use those which operate with capacitive measuring principles.

In the exemplary embodiment represented in FIG. 1, the chip carrier 5 is open on one side, i.e., at its side 22 that is averted from the component-mounting surface 2 of the printed circuit board 3, and has at the upper edge regions 24, 25 bounding the opening 23 a support 26 for making a connection with the holding member of a connecting piece (not represented in more detail) which can be mounted on the chip carrier 5, said connection being a mechanical one which is self-closed and free from play, and being made in such a way that when the connecting piece is mounted onto the chip carrier 5 the holding member and the support 26 alternately come into engagement. For this purpose, the support 26 of the chip carrier 5 has on its outer circumference a peripheral abutment surface 29 which supports the holding member of the connecting piece. Said surface can be constructed, as represented, in the form of a groove 30 which is constructed circumferentially on the edge region of the chip carrier 5 and into which a spring formed on the outer circumference of the connecting piece engages at least partially.

The chip carrier 5 is filled with a flowable filler 32 which completely covers the semiconductor chip 6 and, in particular, constitutes a gel which transmits pressures onto the semiconductor pressure sensor in a fashion virtually free from delay and free from error. The gel serves, on the one hand, to protect the sensitive pressure sensor chip 6 and the further, in particular metallic, constituents of the electronic component, in particular the bonding wires 21, the pins 7 and the leadframe, against environmental influences, but also against contact with the medium 33 to be measured, and in this way to prevent contamination of the component by ions or other damaging constituents of the medium 33, or the risk of corrosion due to environmental influences or the medium 33. Moreover, the gel 32 serves as filler material in order to keep the dead volume between the sensor component and the mounted connecting piece as low as possible, in order to avoid falsification of and time delays in the measurement of the pressure. Moreover, it is provided for the purpose of further separation of the medium to be measured from the semiconductor chip 6 and the constituents of the electronic component which carry a risk of corrosion that the side of the connecting piece facing the chip carrier 5 is sealed with an elastic membrane. The membrane is capable of passing on the pressure pulse of the medium brought up to the sensor without substantial falsification or time delay, but prevents the risk of contamination of an endangered constituent by ions or other damaging parts of the medium.

The side walls 24, 25 of the chip carrier 5 open on one side can, moreover, be fitted with a flow-stopping edge 36 arranged continuously on the inner side. In this case, the inner side of the chip carrier 5 is filled up with the gel 32 only to the level of the flow-stopping edge 36. This flow-stopping edge 36 permits a defined stoppage of the capillary forces of the adhesive gel 32 and thus, on the basis of capillary forces, prevents the gel 32 from undesirably rising up over the housing rims.

We claim:

1. A pressure sensor component for mounting on the component-mounting surface of a printed circuit board, comprising:

a chip carrier produced from an electrically insulating material and formed with an approximately flat chip carrier surface;

a semiconductor chip with a pressure sensor fastened on said chip carrier surface;

electrode connections with a surface-mountable structure electrically connected to said semiconductor chip and penetrating through said chip carrier;

a flowable filler filling part of said chip carrier and completely covering said semiconductor chip; and said chip carrier having a central portion of a lower part lifted above said component-mounting surface of the printed circuit board and lateral parts on two sides of said lower part.

2. The pressure sensor component according to claim 1, wherein said chip carrier is open on a side thereof opposite from the component-mounting surface of the printed circuit board, and said lateral parts defining side walls of said chip carrier formed with a continuous flow-stopping edge on an inner wall surface.

3. The pressure sensor component according to claim 1, which further comprises corrosion-susceptible structural elements of the pressure sensor component, and wherein said flowable filler is disposed to encase said corrosion-susceptible structural elements.

4. The pressure sensor component according to claim 3, wherein said structural elements are metallic structural elements.

5. The pressure sensor component according to claim 3, wherein said structural elements include connecting wires and supporting carriers for said semiconductor chip.

6. The pressure sensor component according to claim 1, wherein said flowable filler is a gel.

7. The pressure sensor component according to claim 1, wherein said electrode connections penetrating said chip carrier are terminal pins led out of at least one side of said chip carrier and bent and cut to form short rocker-shaped connecting stubs.

8. The pressure sensor component according to claim 7, wherein said pins are bent to form bends inside said side parts of said chip carrier.

9. The pressure sensor component according to claim 7, wherein said pins have ends projecting from said side of said chip carrier, said ends being slightly inclined towards the component-mounting surface of the printed circuit board.

10. The pressure sensor component according to claim 1, wherein said chip carrier is produced in one piece.

11. The pressure sensor component according to claim 1, wherein said chip carrier is formed with outer boundary surfaces facing the component-mounting surface of the printed circuit board, said outer boundary surfaces of said chip carrier following an essentially inverted V-shape in a cross section of said chip carrier.

12. The pressure sensor component according to claim 1, wherein said chip carrier is formed with outer boundary surfaces facing the component-mounting surface of the printed circuit board, and wherein a greatest spacing between said outer boundary surfaces and the printed circuit board is substantially 0.1 to substantially 0.5 mm.

13. The pressure sensor component according to claim 1, wherein said chip carrier is produced from a thermoplastic material.

14. The pressure sensor component according to claim 1, wherein said pressure sensor is a piezoresistive pressure sensor.

15. The pressure sensor component according to claim 1, wherein said pressure sensor is a capacitive pressure sensor.

* * * * *